US012726161B2

(12) United States Patent
Tang et al.

(10) Patent No.: US 12,726,161 B2
(45) Date of Patent: Sep. 1, 2026

(54) DIFFERENTIAL AMPLIFIER WITH IMPEDANCE TERMINATIONS

(71) Applicant: Qorvo US, Inc., Greensboro, NC (US)

(72) Inventors: On S. A. Tang, Groton, MA (US); John C. Newton, Belmont, MA (US); Grant Small, Nashua, NH (US); Saraunsh Bayaskar, Lowell, MA (US)

(73) Assignee: Qorvo US, Inc., Greensboro, NC (US)

( * ) Notice: Subject to any disclaimer, the term of this patent is extended or adjusted under 35 U.S.C. 154(b) by 636 days.

(21) Appl. No.: 18/316,272

(22) Filed: May 12, 2023

(65) Prior Publication Data

US 2023/0396224 A1 Dec. 7, 2023

Related U.S. Application Data

(60) Provisional application No. 63/349,629, filed on Jun. 7, 2022.

(51) Int. Cl.
*H03F 3/45* (2006.01)
*H03F 1/32* (2006.01)

(52) U.S. Cl.
CPC ....... *H03F 3/45475* (2013.01); *H03F 1/3211* (2013.01); *H03F 2200/451* (2013.01); *H03F 2203/45138* (2013.01)

(58) Field of Classification Search
CPC ............... H03F 3/45475; H03F 1/3211; H03F 2200/451; H03F 2203/45138; H03F 3/26
USPC ........................................................ 330/149
See application file for complete search history.

(56) References Cited

U.S. PATENT DOCUMENTS 8,164,387 B1 * 4/2012 Apel ..................... H03F 3/3076 330/276
2023/0308062 A1 * 9/2023 Kobayashi ............... H04B 1/04
2023/0378913 A1 * 11/2023 Osgooei .................. H03F 1/223
(Continued)

OTHER PUBLICATIONS

Kumaran, A.K. et al., "On-Chip Output Stage Design for a Continuous Class-F Power Amplifier," 2021 IEEE International Symposium on Circuits and Systems (ISCAS), May 22-28, 2021, Daegu, Korea, IEEE, 5 pages.

(Continued)

*Primary Examiner* — Andrea Lindgren Baltzell
*Assistant Examiner* — Jose E Pinero
(74) *Attorney, Agent, or Firm* — Withrow & Terranova, P.L.L.C.

(57) ABSTRACT

A differential amplifier is disclosed with harmonic terminations. The differential amplifier has a first transistor having a first emitter coupled to a fixed voltage node, a first base, and a first collector. A second transistor has a second emitter coupled to the fixed voltage node, a second base, and a second collector. A first capacitor and a first inductor are coupled in series between the first collector and a virtual ground node. A second inductor and a second capacitor are coupled in series between the second collector and the virtual ground node, and a third inductor is coupled between the virtual ground node and the fixed voltage node. The first and second capacitors and first, second, and third inductors have capacitances and inductances, respectively, that are sized to realize second and third harmonic traps for a radio frequency signal being amplified by the differential amplifier.

24 Claims, 9 Drawing Sheets

(56) References Cited

U.S. PATENT DOCUMENTS

2023/0396224 A1 * 12/2023 Tang ......................... H03F 3/26

OTHER PUBLICATIONS

Stameroff, A. et al., "High Efficiency Push-Pull Inverse Class F Power Amplifier Using a Balun and Harmonic Trap Waveform Shaping Network," 2010 IEEE MTT-S International Microwave Symposium, May 23-28, 2010, Anaheim, CA, IEEE, pp. 521-525.

Zolomy, A. et al., "A low cost 2nd harmonic trap for integrated radios," MIKON 2008—17th International Conference on Microwaves, Radar and Wireless Communications, May 19-21, 2008, Wroclaw, Poland, IEEE, 4 pages.

* cited by examiner

DIFFERENTIAL AMPLIFIER WITH IMPEDANCE TERMINATIONS

RELATED APPLICATIONS

This application claims the benefit of provisional patent application Ser. No. 63/349,629, filed Jun. 7, 2022, the disclosure of which is hereby incorporated herein by reference in its entirety.

FIELD OF THE DISCLOSURE

The present disclosure relates to amplifier structures for maximizing power amplifier linearity and power-added efficiency.

BACKGROUND

Modern radio frequency (RF) power amplifiers are required to be small in physical size, be energy efficient, have linear output, and be relatively low in financial cost. Harmonics in amplified RF signals presently require relatively physically large harmonic traps that do not provide the required small physical size and relatively low financial cost. As such, a need remains for RF power amplifiers that include harmonic traps that allow the RF power amplifiers to have relatively small physical size with relatively low financial cost while still providing energy efficient operation with high linearity output.

SUMMARY

A differential amplifier is disclosed with harmonic terminations. The differential amplifier has a first transistor having a first emitter coupled to a fixed voltage node, a first base, and a first collector. A second transistor has a second emitter coupled to the fixed voltage node, a second base, and a second collector. A first capacitor and a first inductor are coupled in series between the first collector and a virtual ground node. A second inductor and a second capacitor are coupled in series between the second collector and the virtual ground node and a third inductor is coupled between the virtual ground node and the fixed voltage node. The first and second capacitors and first, second, and third inductors have capacitances and inductances, respectively, that are sized to realize second and third harmonic traps for a radio frequency signal being amplified by the differential amplifier.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
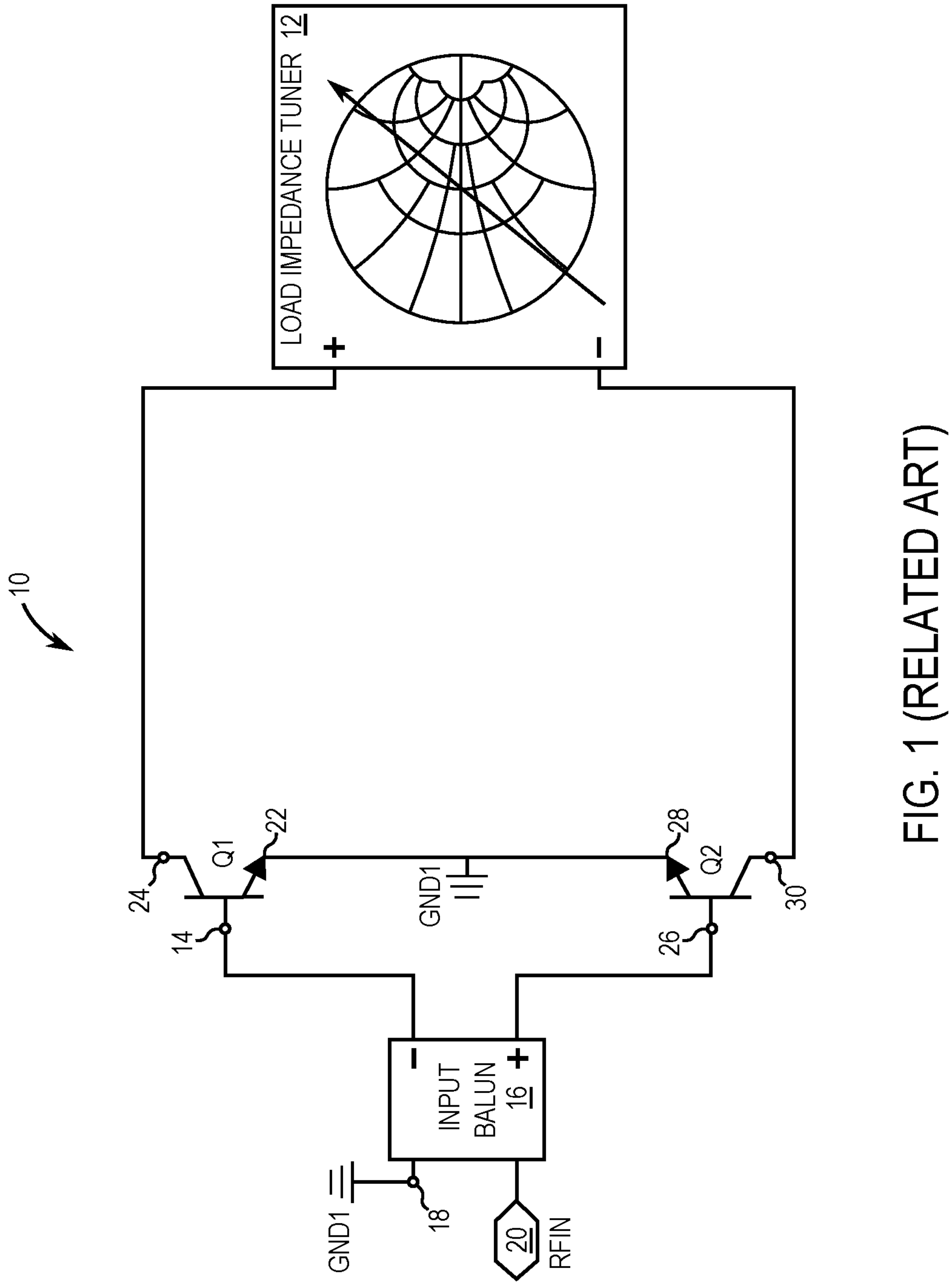
FIG. 1 is a schematic of a related-art differential amplifier that is depicted coupled to a theoretical third harmonic load impedance tuner simulator configured to determine harmonic trap terminations.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is a schematic of a related-art differential amplifier 10 that is depicted coupled to a theoretical third harmonic load impedance tuner simulator 12 configured to determine harmonic trap terminations. The related-art differential amplifier 10 has a first transistor Q1 having a base terminal 14 coupled to a negative output of an input balanced-unbalanced (balun) transformer 16 that has a ground terminal 18 coupled to a fixed voltage node GND1 and an RF input terminal 20 labeled RFIN. In this example, the fixed voltage node is ground. The first transistor Q1 has an emitter terminal 22 coupled to the fixed voltage node GND1. A collector terminal 24 is coupled to a positive input of the load impedance tuner simulator 12. A second transistor Q2 has a base terminal 26 coupled to a positive terminal of the input balun transformer 16, an emitter terminal 28 coupled to the fixed voltage node GND1 and a collector terminal 30 coupled to a negative terminal of the load impedance tuner simulator 12.

Figures 2A, 2B:
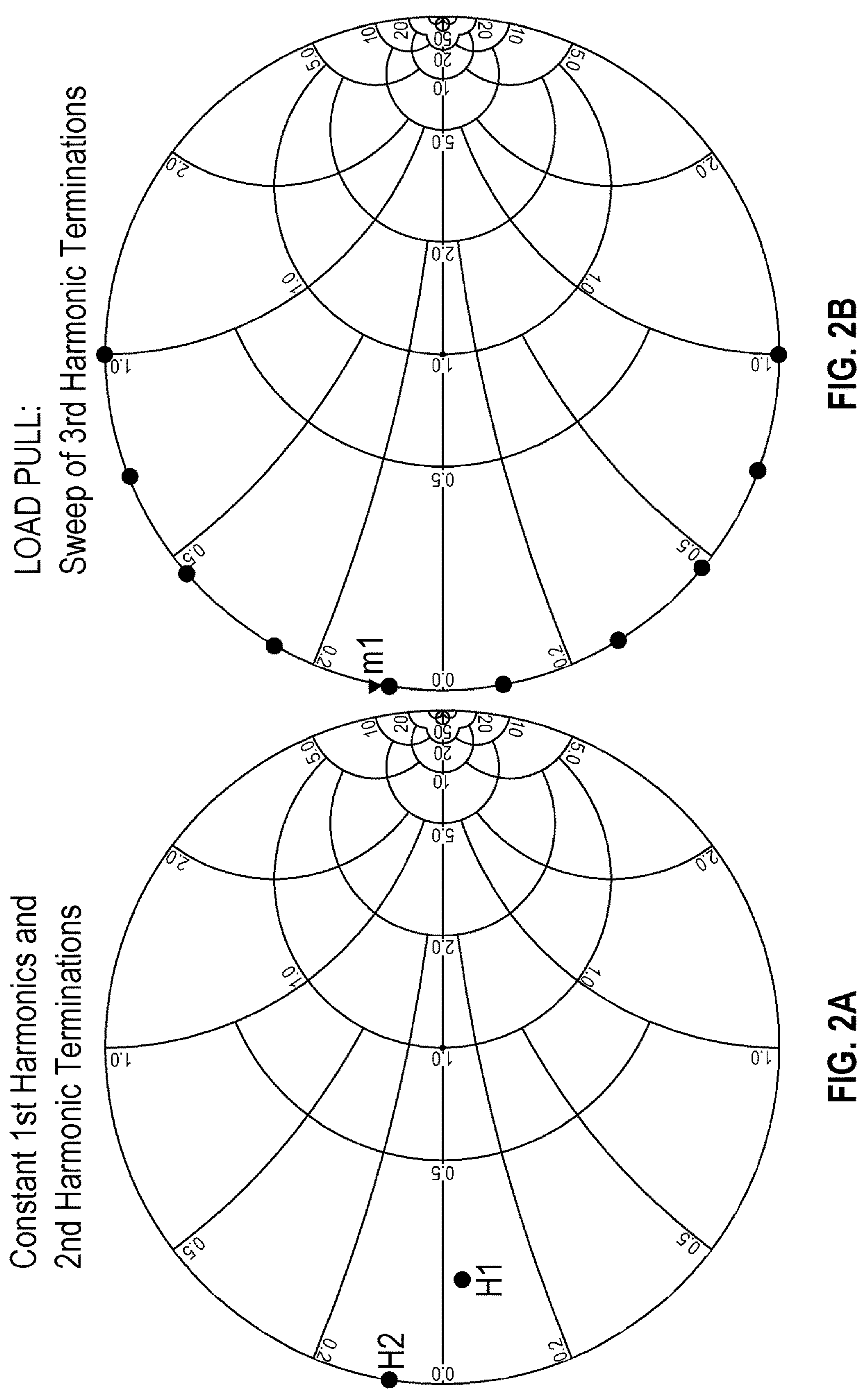
FIG. 2A is a Smith Chart depicting desired first harmonic and second harmonic impedance terminations that are fixed.
FIG. 2B is a Smith Chart depicting a sweep of third harmonic terminations for the related-art differential amplifier of FIG. 1 as determined using the theoretical third harmonic load impedance tuner simulator of FIG. 1.

FIG. 2A is a Smith Chart depicting a desired fixed first harmonic termination H1 and desired fixed second harmonic impedance termination H2. The desired first harmonic termination H1 and the desired fixed second harmonic impedance termination H2 may be added to the related-art differential amplifier to improve the power-added efficiency (PAE) of the related-art differential amplifier 10.

FIG. 2B is a Smith Chart depicting a sweep of third harmonic terminations for the related-art differential amplifier of FIG. 1 as determined through circuit simulation using the theoretical third harmonic load impedance tuner simulator 12 of FIG. 1. The third harmonic terminations are depicted as solid dots located around the periphery of the Smith Chart where the real part of the third harmonic terminations is equal to zero. A marker m1 points to an inductive third harmonic termination.

Figure 3B:
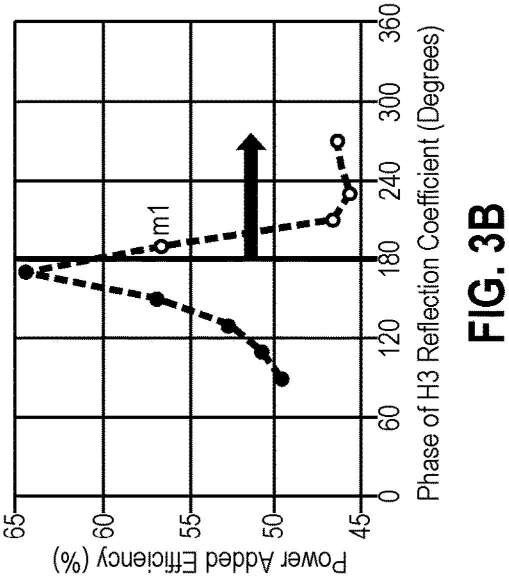
FIG. 3B is a graph of percentage of power-added efficiency versus phase angle of third harmonic reflection coefficient in degrees with capacitive third harmonic terminations highlighted.
Figure 3C:
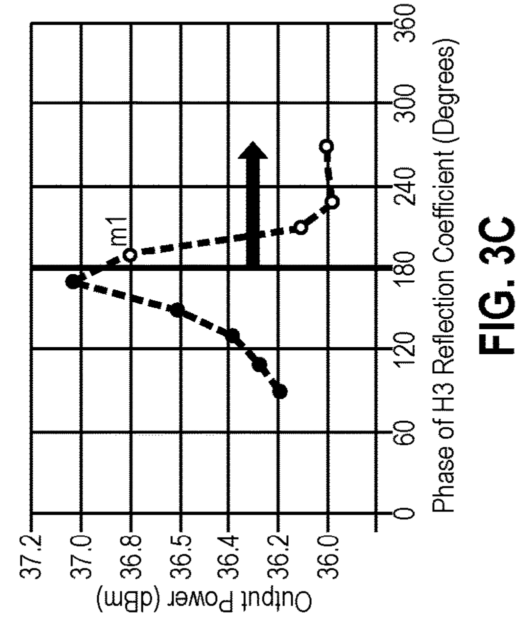
FIG. 3C is graph of output power of a differential amplifier versus phase angle of third harmonic reflection coefficient in degrees with capacitive third harmonic terminations highlighted.
Figure 3A:
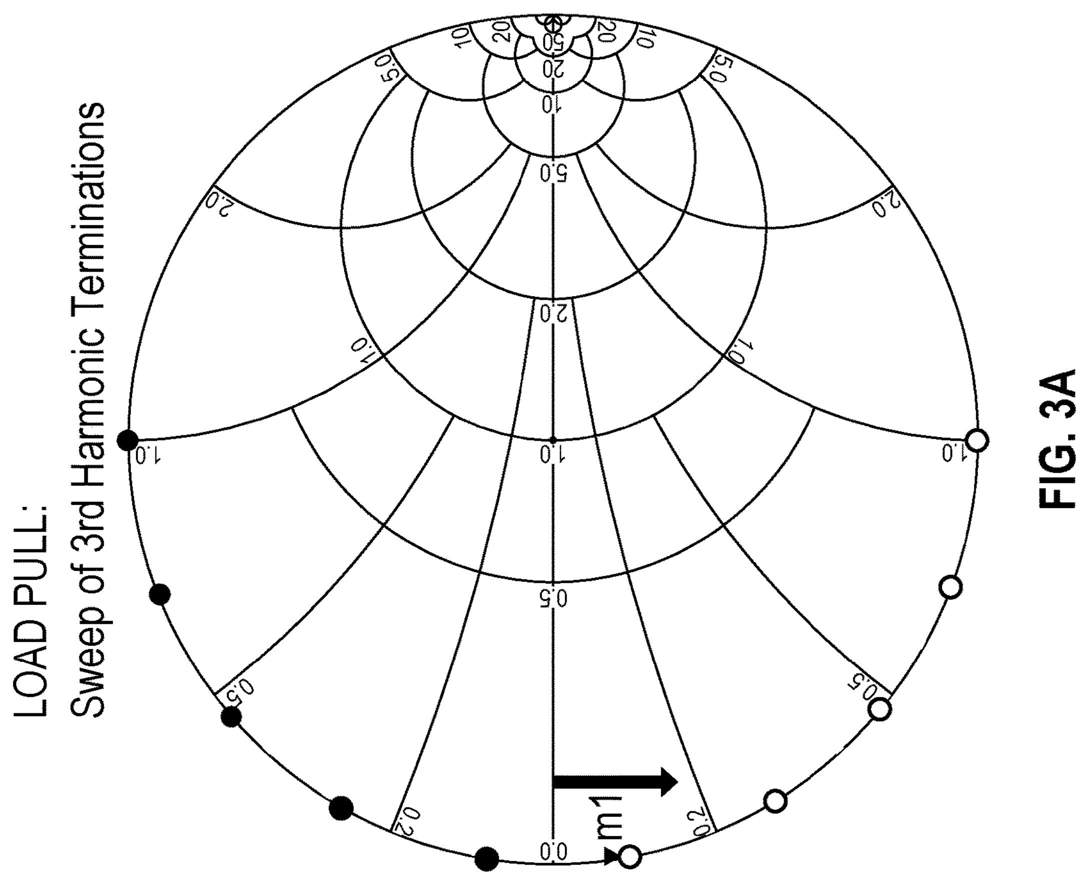
FIG. 3A is a Smith Chart that illustrates the sweep of third harmonic terminations with highlighted capacitive third harmonic terminations.

FIG. 3A is a Smith Chart that illustrates the sweep of third harmonic terminations with highlighted capacitive third harmonic terminations indicated by hollow dots. In this case, the maker m1 is moved to a more capacitive third harmonic termination. Increasing capacitive third harmonic terminations are indicated in the direction of a broad black arrow near the marker m1.

FIG. 3B is a graph of percentage of power-added efficiency versus phase angle of third harmonic reflection coefficient in degrees with capacitive third harmonic terminations indicated by hollow dots. A broad black arrow pointing to the right indicates more capacitive third harmonic terminations. Note that the marker m1 indicates a power-added efficiency of just over 55% at a phase of third harmonic H3 reflection coefficient just over 180°.

FIG. 3C is graph of output power of a differential amplifier versus phase angle of third harmonic reflection coefficient in degrees with capacitive third harmonic terminations indicated by hollow dots. A broad black arrow pointing to the right indicates more capacitive third harmonic terminations. Note that the marker m1 indicates an output power of 36.8 dBm at a phase of third harmonic H3 reflection coefficient just over 180°.

Figure 4B:
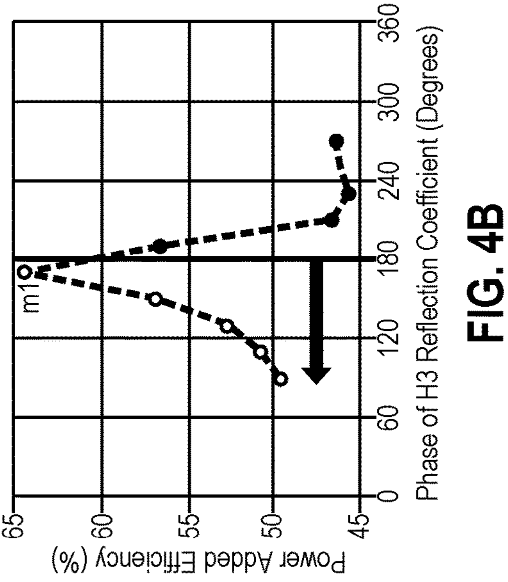
FIG. 4B is a graph of percentage of power-added efficiency versus phase angle of third harmonic reflection coefficient in degrees with inductive third harmonic terminations highlighted.
Figure 4C:
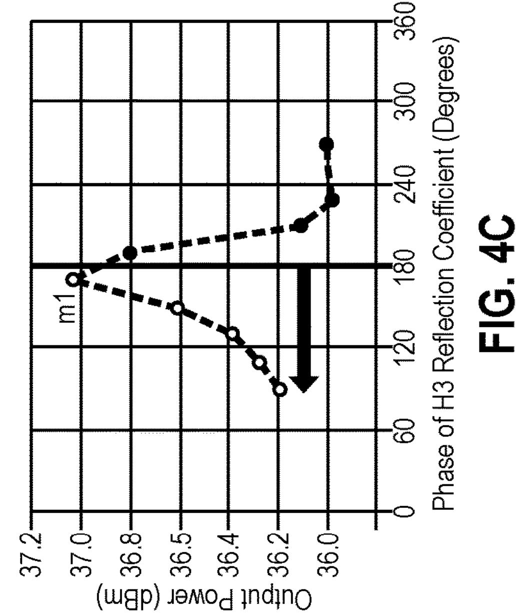
FIG. 4C is graph of output power of a differential amplifier versus phase angle of third harmonic reflection coefficient in degrees with inductive third harmonic terminations highlighted.
Figure 4A:
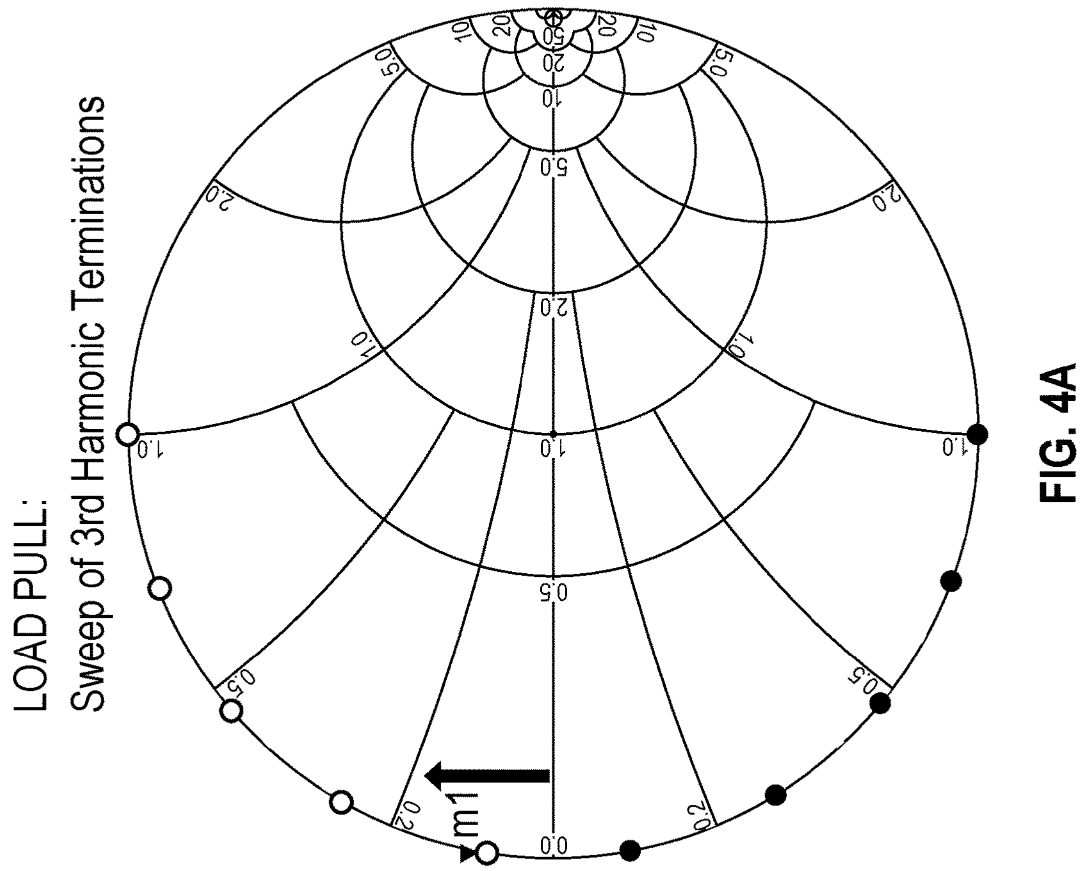
FIG. 4A is a Smith Chart that illustrates the sweep of third harmonic terminations with highlighted inductive third harmonic terminations.

FIG. 4A is a Smith Chart that illustrates the sweep of third harmonic terminations with inductive third harmonic terminations indicated by hollow dots. In this case, the maker m1 is moved to a more inductive third harmonic termination. Increasing inductive third harmonic terminations are indicated in the direction of a broad black arrow near the marker m1.

FIG. 4B is a graph of percentage of power-added efficiency versus phase angle of third harmonic reflection coefficient in degrees with inductive third harmonic terminations indicated by hollow dots. A broad black arrow pointing to the left indicates more inductive third harmonic terminations. Note that the marker m1 indicates a power-added efficiency of nearly 65% at a phase of third harmonic H3 reflection coefficient just under 180°. Thus, there is a nearly 10% improvement in power-added efficiency by employing inductive third harmonics terminations compared with the capacitive third harmonic terminations depicted in FIG. 3B.

FIG. 4C is graph of output power of a differential amplifier versus phase angle of third harmonic reflection coefficient in degrees with inductive third harmonic terminations indicated by hollow dots. A broad black arrow pointing to the left indicates more inductive third harmonic terminations. Note that the marker m1 indicates an output power of over 37.0 dBm at a phase of third harmonic H3 reflection coefficient just under 180°.

Figure 5A:
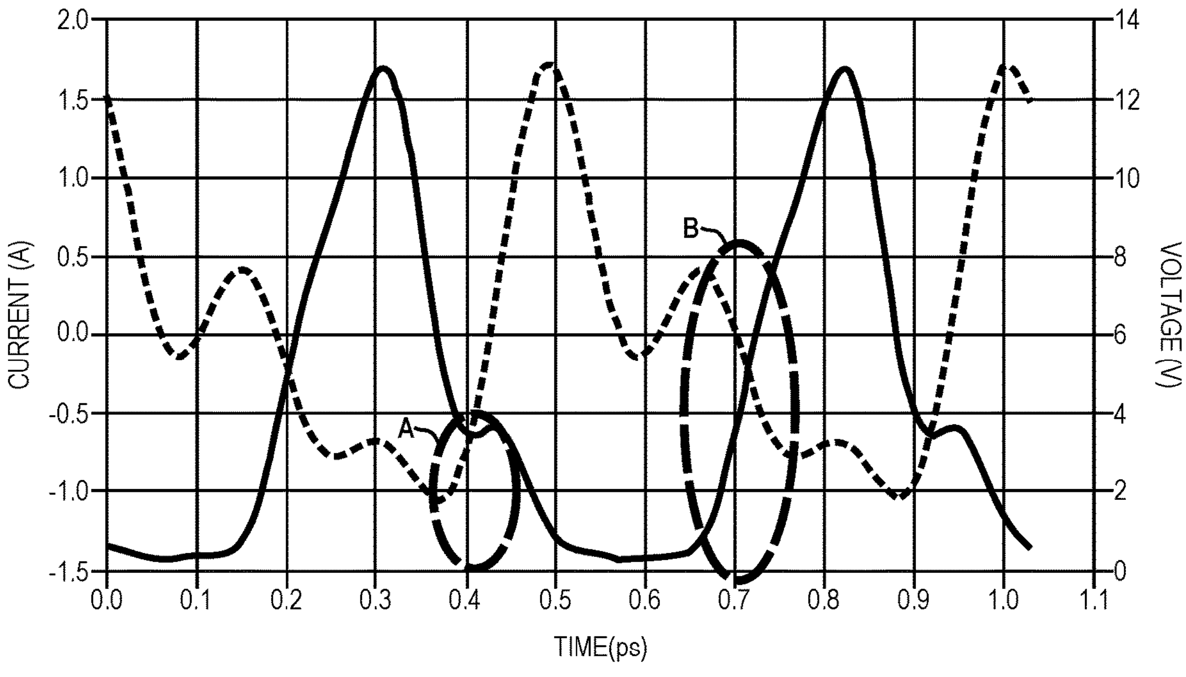
FIG. 5A is a graph of current and voltage of half sinusoid time-domain waveforms corresponding to output power during operation with a capacitive third harmonic termination.

FIG. 5A is a graph of current and voltage of half sinusoid time-domain waveforms corresponding to output power during operation with a capacitive third harmonic termination. An ellipse labeled A identifies an exemplary overlap of a current waveform depicted in short-dashed line and a voltage waveform depicted in solid line. Another ellipse labeled B identifies another exemplary overlap of the current waveform depicted in short-dashed line and the voltage waveform depicted in solid line. Ellipse A and Ellipse B each indicate relatively high resistive heating losses caused by the relatively large overlaps of the current waveform and the voltage waveform due to a capacitive termination.

Figure 5B:
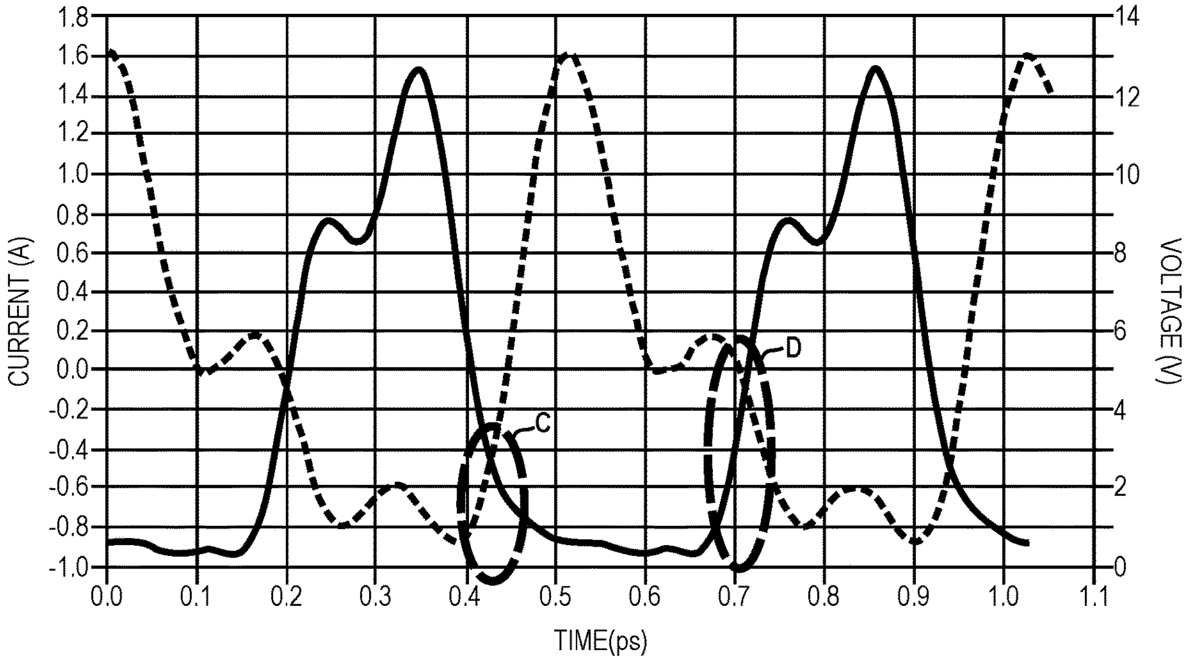
FIG. 5B is a graph of current and voltage of half sinusoid time-domain waveforms corresponding to output power during operation with an inductive third harmonic termination.

FIG. 5B is a graph of current and voltage of half sinusoid time-domain waveforms corresponding to output power during operation with an inductive third harmonic termination. An ellipse labeled C identifies an exemplary overlap of the current waveform depicted in short-dashed line and the voltage waveform depicted in solid line. Another ellipse labeled D identifies another exemplary overlap of the current waveform depicted in short-dashed line and the voltage waveform depicted in solid line. Ellipse C and Ellipse D each indicate relatively low resistive heating losses reduced by the relatively small overlaps of the current waveform and the voltage waveform due to an inductive third harmonic termination.

Figure 6:
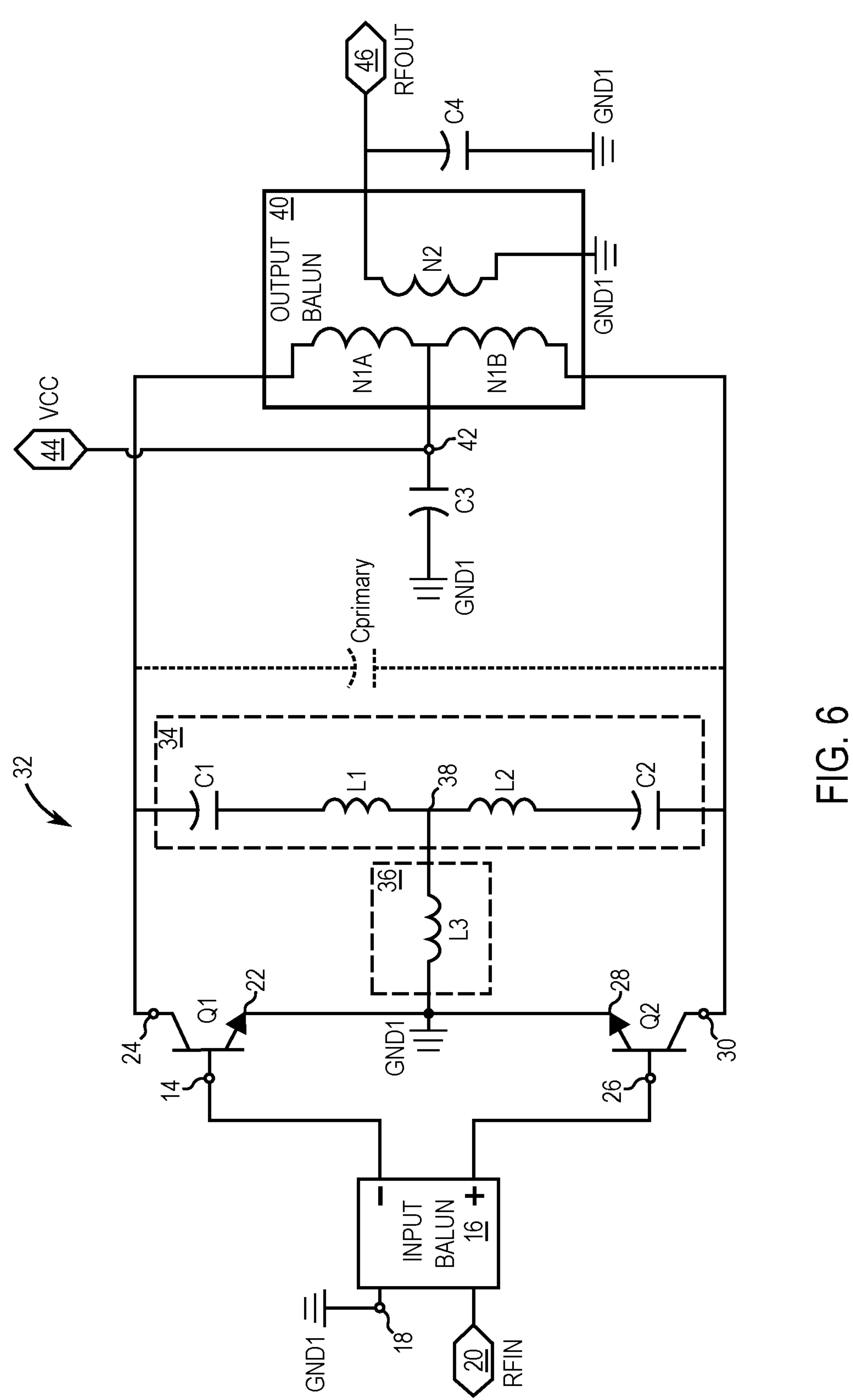
FIG. 6 is a schematic of a differential amplifier that includes class B short-circuit second and third harmonic impedance traps that is in accordance with the present disclosure.

FIG. 6 is a schematic of an exemplary differential amplifier 32 that in accordance with the present disclosure includes class B short-circuit type third harmonic terminations 34 and a class B short-circuit type second harmonic impedance termination 36. The third harmonic terminations 34 include a first capacitor C1 coupled in series with a first inductor L1 between the collector terminal 24 and a virtual ground node 38. A second capacitor C2 is coupled in series with a second inductor L2 between the collector terminal 30 and the virtual ground node 38. In some exemplary embodiments, each of the first capacitor C1 and the second capacitor C2 have a capacitance value that is twice the capacitance value of a primary capacitor Cprimary that is typically coupled across primary windings N1A and N1B of an output balun transformer 40. Note that the primary capacitor Cprimary does not exist in the exemplary differential amplifier 32 and is shown in short-dashed line to represent the non-existence of the primary capacitor Cprimary. Inductance values for the first inductor L1 and the second inductor L2 are sized to filter/trap a third harmonic of an amplified version of an RF signal that arrives at the RF input terminal 20 (RFIN).

The second harmonic impedance termination 36 has at least one inductor L3 coupled between the virtual node 38 and the fixed voltage node GND1. The inductor L3 in combination with the third harmonic terminations is sized to filter/trap a second harmonic of an amplified version of the RF signal that arrives at the RF input terminal 20 (RFIN). Moreover, it is to be understood that the combination of the third harmonic termination 34 and the second harmonic impedance termination 36 is configured for class B operation of the differential amplifier 32. In this configuration, the third harmonic terminations 34 and the second harmonic impedance termination 36 both function as short circuits during the class B operation of the differential amplifier 32. Therefore, the third harmonic terminations 34 and the second harmonic impedance termination 36 function as class B harmonic traps.

Returning to the structure of the output balun transformer 40, there is a tap terminal 42 through which power is supplied to the first transistor Q1 and the second transistor Q2. The tap terminal 42 is direct current coupled to a supply terminal 44 that receives a source voltage VCC. A supply filter capacitor C3 is coupled between the tap terminal 42 and the fixed voltage node GND1, which in this exemplary embodiment is at ground potential. A secondary winding N2 is coupled between the fixed voltage node GND1 and an RF output terminal 46 labeled RFOUT. An output filter capacitor C4 is coupled between the fixed voltage node GND1 and the RF output terminal 46 (RFOUT).

Figures 7A, 7B:
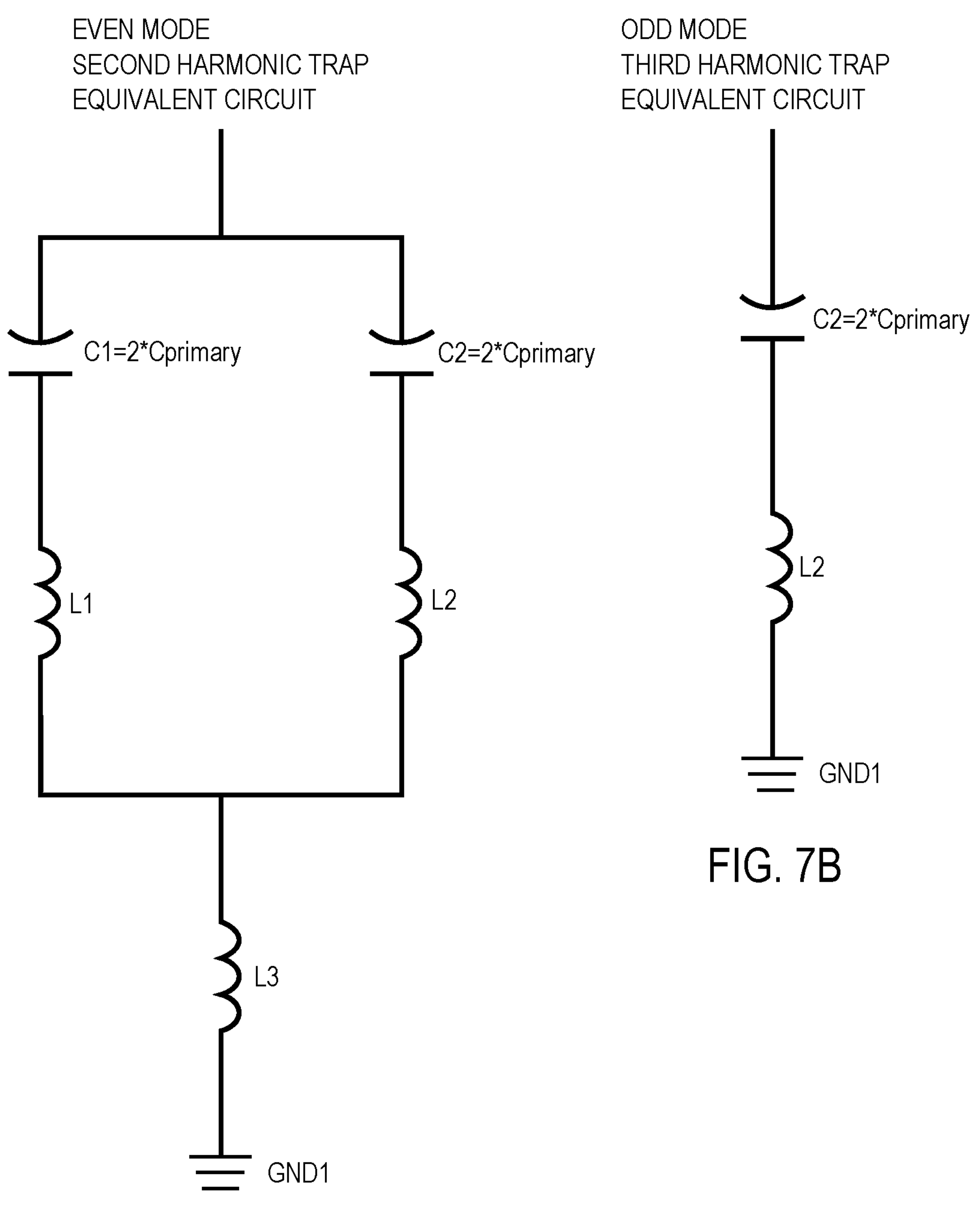
FIG. 7A is a schematic of an even mode second harmonic trap equivalent circuit for the second harmonic impedance trap of the differential amplifier of FIG. 6.
FIG. 7B is a schematic of an odd mode third harmonic trap equivalent circuit of the differential amplifier of FIG. 6.

FIG. 7A is a schematic of an even mode second harmonic trap equivalent circuit for the second harmonic impedance trap of the differential amplifier of FIG. 6. FIG. 7B is a schematic of an odd mode third harmonic trap equivalent circuit of the differential amplifier of FIG. 6.

Figure 8:
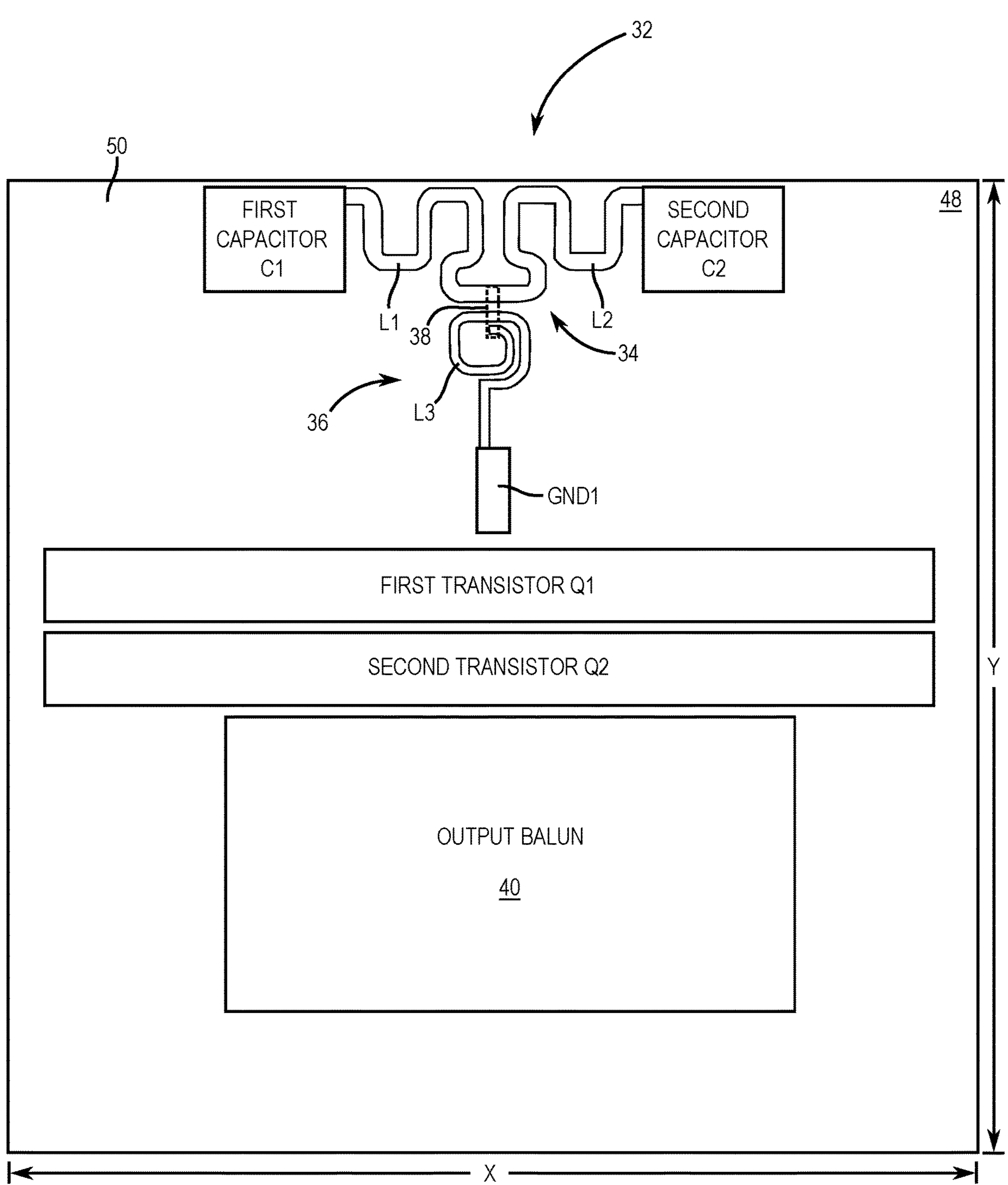
FIG. 8 is a layout diagram for an integrated circuit die that integrates the third harmonic impedance terminations with the second harmonic termination to realize the differential amplifier in accordance with the present disclosure.

FIG. 8 is a layout diagram for an integrated circuit die 48 that integrates the third harmonic terminations 34 with the second harmonic impedance termination 36 to realize the differential amplifier 32 in accordance with the present disclosure. The integrated circuit 48 has a semiconductor substrate 50 onto which the differential amplifier 32 is fabricated. A dashed rectangle represents the virtual node 38. Areal dimensions of the integrated circuit 48 are represented by an X dimension and a Y dimension. In at least some embodiments, either of the X dimension and the Y dimension range between 800 micrometers (μm) and 1000 μm. In one exemplary embodiment, the X dimension and the Y dimension are both 870 μm±10%. In at least some embodiments, the differential amplifier 32 is configured to amplify RF signals having frequencies that range from 1.4 GHz to 2.1 GHz.

Figure 9:
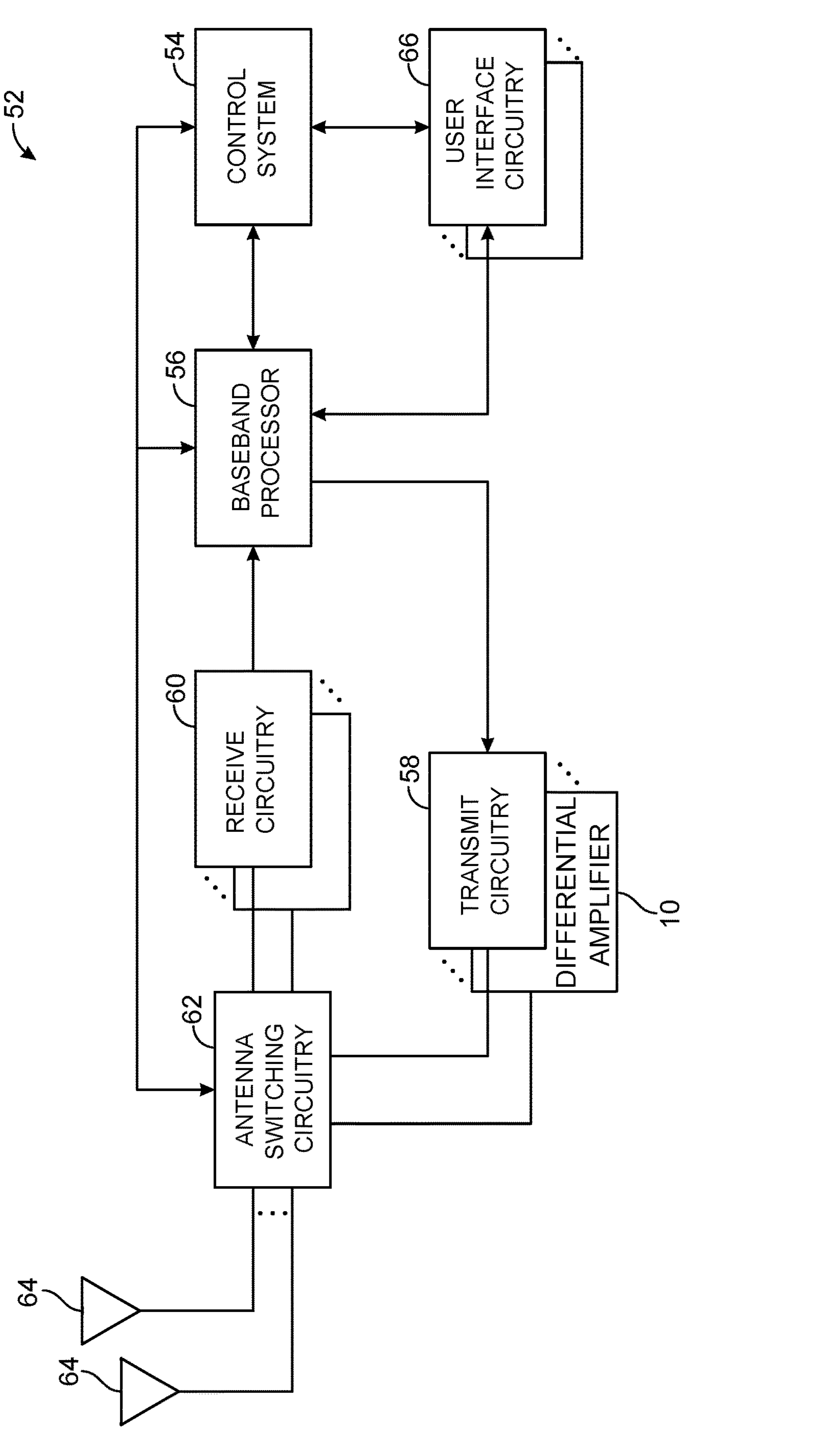
FIG. 9 is a schematic of a wireless communication device that incorporates the differential amplifier of the present disclosure.

With reference to FIG. 9, the concepts described above may be implemented in various types of wireless communication devices or user elements 52, such as mobile terminals, smart watches, tablets, computers, navigation devices, access points, and the like that support wireless communications, such as cellular, wireless local area network (WLAN), Bluetooth, and near-field communications. The user elements 52 will generally include a control system 54, a baseband processor 56, transmit circuitry 58, receive circuitry 60, antenna switching circuitry 62, multiple antennas 64, and user interface circuitry 66. The receive circuitry 60 receives radio frequency signals via the antennas 64 and through the antenna switching circuitry 62 from one or more basestations. A low-noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 56 processes the digitized received signal to extract the information or data bits conveyed in the received signal. This processing typically comprises demodulation, decoding, and error correction operations. The baseband processor 56 is generally implemented in one or more digital signal processors (DSPs) and application-specific integrated circuits (ASICs). For transmission, the baseband processor 56 receives digitized data, which may represent voice, data, or control information, from the control system 54, which it encodes for transmission. The encoded data is output to the transmit circuitry 58, where it is used by a modulator to modulate a carrier signal that is at a desired transmit frequency or frequencies. The differential power amplifier 10 will amplify the modulated carrier signal to a level appropriate for transmission and deliver the modulated carrier signal to the antennas 64 through the antenna switching circuitry 62. The multiple antennas 64 and the replicated transmit circuitry 58 and receive circuitry 60 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A differential amplifier comprising:

a radio frequency (RF) input terminal configured to receive an RF signal;

an RF output terminal configured to output an amplified version of the RF signal;

a first transistor having a first emitter coupled to a fixed voltage node, a first base communicatively coupled to the RF input, and a first collector communicatively coupled to the RF output terminal;

a second transistor having a second emitter coupled to the fixed voltage node, a second base communicatively coupled to the RF input, and a second collector communicatively coupled to the RF output terminal;

a first capacitor and a first inductor coupled in series between the first collector and a virtual ground node;

a second inductor and a second capacitor coupled in series between the second collector and the virtual ground node; and a third inductor coupled between the virtual ground node and the fixed voltage node; wherein the differential amplifier is integrated into an integrated circuit having an areal dimension between 800 micrometers (μm) by 800 μm and 1000 μm by 1000 μm.

2. The differential amplifier of claim 1 wherein the first inductor and the second inductor are configured to filter a third harmonic of the amplified version of the RF signal.

3. The differential amplifier of claim 2 wherein the third inductor is configured in combination with the first inductor and the second inductor to filter a second harmonic of the amplified version of the RF signal.

4. The differential amplifier of claim 3 wherein the first capacitor and the second capacitor are configured to improve second and third harmonic filtering of the RF signal.

5. The differential amplifier of claim 1 further comprising an output balanced-unbalanced (balun) transformer having a first winding coupled between the first collector and a tap terminal, and a second winding coupled between the second collector and the tap terminal, and a third winding coupled between the fixed voltage node and the RF output terminal.

6. The differential amplifier of claim 5 wherein there is no primary capacitor coupled directly across the first winding and the second winding.

7. The differential amplifier of claim 5 further comprising a supply filter capacitor coupled between the tap terminal and the fixed voltage node.

8. The differential amplifier of claim 1 further comprising an input balun transformer coupled between the first base, the second base, and the RF input.

9. The differential amplifier of claim 1 further configured to amplify RF signals having frequencies between 1.4 gigahertz (GHz) to 2.1 GHz.

10. The differential amplifier of claim 1 wherein the fixed voltage node is ground.

11. A method for reducing harmonic distortion in a differential amplifier comprising steps of:

coupling a first capacitor and a first inductor in series between a first collector of the differential amplifier and a virtual ground node;

coupling a second capacitor and a second inductor in series between a second collector of the differential amplifier and the virtual ground node, wherein the first collector and the second collector are communicatively coupled to a radio frequency (RF) output terminal;

sizing inductances of the first inductor and the second inductor to filter a third harmonic of an amplified version of an RF signal that arrives at an RF input terminal of the differential amplifier; and integrating the differential amplifier into an integrated circuit having an areal dimension between 800 micrometers (μm) by 800 μm and 1000 μm by 1000 μm.

12. The method for reducing harmonic distortion in the differential amplifier of claim 11 further comprising coupling a third inductor between the virtual ground node and a fixed voltage node.

13. The method for reducing harmonic distortion in the differential amplifier of claim 12 further comprising sizing inductance of the third inductor to filter a second harmonic of the amplified version of the RF signal that arrives at the RF input terminal of the differential amplifier.

14. The method for reducing harmonic distortion in the differential amplifier of claim 12 wherein the fixed voltage node is ground.

15. A wireless communication device comprising:

a baseband processor;

transmit circuitry configured to receive encoded data from the baseband processor and to modulate a carrier signal with the encoded data, wherein the transmit circuitry comprises:

a radio frequency (RF) input terminal configured to receive an RF signal;

an RF output terminal configured to output an amplified version of the RF signal;

a first transistor having a first emitter coupled to a fixed voltage node, a first base communicatively coupled to the RF input, and a first collector communicatively coupled to the RF output terminal;

a second transistor having a second emitter coupled to the fixed voltage node, a second base communicatively coupled to the RF input, and a second collector communicatively coupled to the RF output terminal;

a first capacitor and a first inductor coupled in series between the first collector and a virtual ground node;

a second inductor and a second capacitor coupled in series between the second collector and the virtual ground node; and a third inductor coupled between the virtual ground node and the fixed voltage node; wherein the differential amplifier is integrated into an integrated circuit having an areal dimension between 800 micrometers (μm) by 800 μm and 1000 μm by 1000 μm.

16. The wireless communication device of claim 15 wherein the first inductor and the second inductor are configured to filter a third harmonic of the amplified version of the RF signal.

17. The wireless communication device of claim 16 wherein the third inductor is configured in combination with the first inductor and the second inductor to filter a second harmonic of the amplified version of the RF signal.

18. The wireless communication device of claim 17 wherein the first capacitor and the second capacitor are configured to improve second and third harmonic filtering of the RF signal.

19. The wireless communication device of claim 15 further comprising an output balanced-unbalanced (balun) transformer having a first winding coupled between the first collector and a tap terminal, and a second winding coupled between the second collector and the tap terminal, and a third winding coupled between the fixed voltage node and the RF output terminal.

20. The wireless communication device of claim 19 wherein there is no primary capacitor coupled directly across the first winding and the second winding.

21. The wireless communication device of claim 20 further comprising a supply filter capacitor coupled between the tap terminal and the fixed voltage node.

22. The wireless communication device of claim 15 further comprising an input balun transformer coupled between the first base, the second base, and the RF input.

23. The wireless communication device of claim 15 further configured to amplify RF signals having frequencies between 1.4 gigahertz (GHz) to 2.1 GHz.

24. The wireless communication device of claim 15 wherein the fixed voltage node is ground.

* * * * *